United States Patent
Sasaki et al.

(10) Patent No.: US 10,729,018 B2
(45) Date of Patent: Jul. 28, 2020

(54) PROCESS FOR PRODUCING LAMINATE AND PROCESS FOR PRODUCING PRINTED BOARD

(71) Applicant: AGC Inc., Chiyoda-ku (JP)

(72) Inventors: Toru Sasaki, Chiyoda-ku (JP); Wataru Kasai, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 16/125,265

(22) Filed: Sep. 7, 2018

(65) Prior Publication Data

US 2019/0008053 A1     Jan. 3, 2019

Related U.S. Application Data

(63) Continuation of application No. PCT/JP2017/009071, filed on Mar. 7, 2017.

(30) Foreign Application Priority Data

Mar. 8, 2016 (JP) ................................. 2016-044175

(51) Int. Cl.
*C23F 1/00* (2006.01)
*H05K 3/46* (2006.01)
(Continued)

(52) U.S. Cl.
CPC .......... *H05K 3/4682* (2013.01); *B29C 65/18* (2013.01); *B29C 65/4815* (2013.01);
(Continued)

(58) Field of Classification Search
CPC ....................................................... C23F 1/00
See application file for complete search history.

(56) References Cited

U.S. PATENT DOCUMENTS

| 6,197,393 B1 * | 3/2001 | Jing | ........................ B32B 27/08 428/35.9 |
| 2012/0152323 A1 * | 6/2012 | Perry | ...................... B32B 27/08 136/251 |

(Continued)

FOREIGN PATENT DOCUMENTS

| JP | 4694142 | 6/2011 |
| JP | 2012-106491 | 6/2012 |

(Continued)

OTHER PUBLICATIONS

International Search Report dated Apr. 25, 2017 in PCT/JP2017/009071 filed Mar. 7, 2017 (with English Translation).

*Primary Examiner* — Thomas T Pham
(74) *Attorney, Agent, or Firm* — Oblon, McClelland, Maier & Neustadt, L.L.P.

(57) ABSTRACT

To stably produce a laminate wherein heat resistant resin layers are laminated on both surfaces of a fluorinated resin layer, by thermal lamination.

A process for producing a laminate, which comprises a preliminary heating step of heating, while conveying by a metal roll 33 for heating and a metal roll 32 for thermal lamination without pressing in the thickness direction, a temporary laminate wherein heat resistant resin films 2 and 2 are laminated on both surfaces of a fluorinated resin film 1 containing a melt-moldable fluorinated resin (A) having at least one type of functional groups selected from the group consisting of a carbonyl group-containing group, a hydroxyl group, an epoxy group and an isocyanate group and after the preliminary heating step, a thermal lamination step of pressing the temporary laminate in the thickness direction, while heating it by metal rolls 31 and 32 for thermal lamination at (Continued)

a thermal lamination temperature of at least the melting point of the fluorinated resin (A) ant at most 420° C., for bonding.

13 Claims, 2 Drawing Sheets

(51) Int. Cl.
B32B 27/30 (2006.01)
B29C 65/00 (2006.01)
H05K 1/03 (2006.01)
B32B 37/00 (2006.01)
B29C 65/18 (2006.01)
B29C 65/48 (2006.01)
B29C 65/50 (2006.01)
B29C 65/78 (2006.01)
H05K 3/06 (2006.01)

(52) U.S. Cl.
CPC ...... *B29C 65/5057* (2013.01); *B29C 65/7894* (2013.01); *B29C 66/034* (2013.01); *B29C 66/1122* (2013.01); *B29C 66/344* (2013.01); *B29C 66/45* (2013.01); *B29C 66/71* (2013.01); *B29C 66/7352* (2013.01); *B29C 66/83411* (2013.01); *B29C 66/83413* (2013.01); *B29C 66/919* (2013.01); *B29C 66/91933* (2013.01); *B32B 27/30* (2013.01); *B32B 37/00* (2013.01); *H05K 1/036* (2013.01); *H05K 1/0373* (2013.01); *H05K 3/06* (2013.01); *H05K 2201/015* (2013.01); *H05K 2201/0154* (2013.01); *H05K 2203/1545* (2013.01)

(56) References Cited

U.S. PATENT DOCUMENTS

| | | | |
|---|---|---|---|
| 2013/0213696 A1* | 8/2013 | Yamamoto | H05K 3/386 174/254 |
| 2016/0272805 A1 | 9/2016 | Nakanishi et al. | |
| 2017/0066861 A1* | 3/2017 | Terada | C08F 214/265 |

FOREIGN PATENT DOCUMENTS

| | | |
|---|---|---|
| JP | 2016-215602 | 12/2016 |
| WO | WO 2010/084867 A1 | 7/2010 |
| WO | WO 2015/098776 A1 | 7/2015 |
| WO | WO 2015/199193 A1 | 12/2015 |
| WO | WO 2016/104297 A1 | 6/2016 |

* cited by examiner

PROCESS FOR PRODUCING LAMINATE AND PROCESS FOR PRODUCING PRINTED BOARD

TECHNICAL FIELD

The present invention relates to a process for producing a laminate and a process for producing a printed board using it.

BACKGROUND ART

For example, a printed board is produced via a step of etching a metal foil of a laminate having a metal foil layer (such as copper foil) as a conductive layer laminated on an insulating layer (such as a polyimide) to remove unnecessary portions and thereby to form a patterned circuit.

Heretofore, an epoxy resin, an acrylic resin or the like has been used as an adhesive for an insulating layer and a metal foil layer or insulating layers each other, however, it has been studied to use a fluorinated resin which is excellent in electric properties in order to improve the electric reliability of a printed board.

Patent Document 1 discloses a process for producing a laminate for a printed board, which comprises between two laminated films wherein a conductive layer is laminated on a non-thermoplastic aromatic polyimide resin layer, sandwiching a fluorinated resin film so as to be in contact with the polyimide resin layer, followed by press bonding under a heating atmosphere.

According to this method, a laminate having a structure wherein the polyimide resin layers are laminated on both surfaces of the fluorinated resin layer, can be obtained.

PRIOR ART DOCUMENTS

Patent Documents

Patent Document 1: Japanese Patent No. 4694142

DISCLOSURE OF INVENTION

Technical Problem

Heretofore, as a method for continuously producing a laminate comprising plural films, thermal lamination has been known. For example, in the thermal lamination, each roll rolling up each film is prepared, and while continuously feeding the film from each roll, overlaid films are heated, pressed and thereby bonded by a method such that the overlaid films are passed between one pair of metal rolls.

However, a method for continuously producing a laminate is not described in Patent Document 1.

According to knowledges of the present inventors, etc., if a fluorinated resin film being sandwiched with heat resistant resin films (such as polyimide films) is bonded by thermal lamination, the fluorinated resin film on which tension is being applied in the longitudinal direction shrinks in the width direction at the moment of being heated and pressed, and in some cases, the fluorinated resin film may be cut.

The present invention provides a process for stably producing a laminate having a structure wherein heat resistant resin layers are laminated on both surfaces of a fluorinated resin layer, by thermal lamination, and provides a process for producing a printed board using it.

Solution to Problem

The present invention has the following features.

[1] A process for producing a laminate comprising a fluorinated resin layer made of a fluorinated resin film, and heat resistant resin layers made of a heat resistant resin film, which comprises a preliminary heating step of heating, while conveying without pressing in the thickness direction, a temporary laminate wherein heat resistant resin films made of a heat resistant resin are laminated on both surfaces of a fluorinated resin film made of a melt-moldable fluorinated resin having at least one type of functional groups selected from the group consisting of a carbonyl group-containing group, a hydroxyl group, an epoxy group and an isocyanate group and after the preliminary heating step, a thermal lamination step of pressing the temporary laminate in the thickness direction, while heating it at a thermal lamination temperature of at least the melting point of the fluorinated resin ant at most 420° C., for bonding.

[2] The process for producing a laminate according to [1], wherein in the thermal lamination step, the temperature of the temporary laminate immediately before being pressed is at least a temperature lower by 20° C. than the melting point of the fluorinated resin and at most the thermal lamination temperature.

[3] The process for producing a laminate according to or [2], wherein the fluorinated resin film is a monolayer film or a laminated film and has a total thickness of from 1 to 1,000 μm.

[4] The process for producing a laminate according to any one of [1] to [3], wherein the fluorinated resin has a melting point of from 260 to 320° C.

[5] The process for producing a laminate according to any one of [1] to [4], wherein the fluorinated resin has a melt flow rate of from 0.5 to 15 g/10 min at 372° C. under a load of 49N.

[6] The process for producing a laminate according to any one of [1] to [5], wherein the fluorinated resin is a fluoropolymer having units (u1) derived from tetrafluoroethylene, units (u2) derived from a cyclic hydrocarbon monomer having an acid anhydride and units (u3) derived from a fluorinated monomer (except TFE).

[7] The process for producing a laminate according to any one of [1] to [6], wherein the heat resistant resin films are monolayer films or laminated films and have a total thickness of from 3 to 500 μm.

[8] The process for producing a laminate according to any one of [1] to [7], wherein the heat resistant resin films are heat curable resin films.

[9] The process for producing a laminate according to [8], wherein the heat curable resin is a heat curable polyimide, an epoxy resin or an acrylic resin.

[10] The process for producing a laminate according to [8] or [9], wherein the heat curable resin is a polyimide formed by imidizing a polyamic acid obtained by polycondensation of a polyvalent carboxylic acid dianhydride and diamine.

[11] The process for producing a laminate according to any one of [8] to [10], wherein the thermal lamination temperature is from 350 to 420° C.

[12] The process for producing a laminate according to any one of [8] to [11], wherein the thermal lamination pressure is from 49 to 1,764 N/cm of roll pressure represented by load to be applied per 1 cm width of a roll.

[13] The process for producing a laminate according to any one of [1] to [12], wherein the temporary laminate further has a metal foil layer on a surface on an opposite side of the surface in contact with the fluorinated resin film, of at least one of the heat resistant resin films.

[14] The process for producing a laminate according to [13], wherein the metal foil layer is a foil made of cupper or an alloy thereof, stainless steel, nickel or an ally thereof, or aluminum or an alloy thereof.

[15] A process for producing a printed circuit board, which has a step of producing a laminate by the process as defined in [14] and etching the metal foil layer of the obtained laminate to form a patterned circuit.

Advantageous Effects of Invention

According to the process for producing a laminate of the present invention, a laminate having a structure wherein heat resistant resin layers are laminated on both surface of a fluorinated resin layer are continuously and stably produced by thermal lamination.

According to the process for producing a printed board of the present invention, a printed board wherein heat resistant resin layers are laminated on both surfaces of a fluorinated resin layer, and a patterned circuit made of a metal foil is formed on the heat resistant layer, can be stably produced.

DESCRIPTION OF EMBODIMENTS

Figure 1:
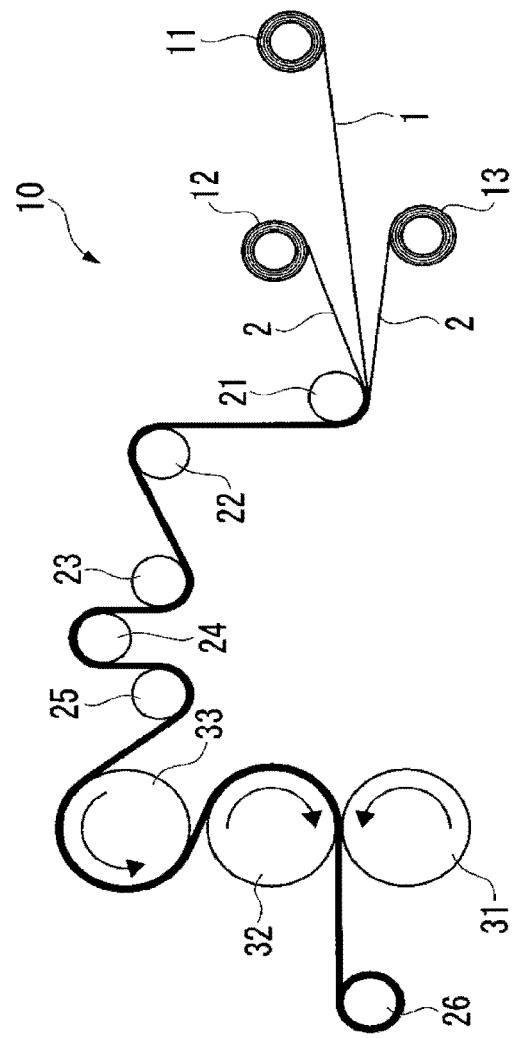
FIG. 1 is a schematic structural view illustrating one example of thermal lamination apparatus of the present invention.

The following definitions of terms are applied over the present specification and the scope of claims.

"Melting point" is a temperature corresponding to the maximum value of a melting peak measured by a differential scanning calorimetry (DSC) method.

"Thermal lamination" is bonding two or more members by pressing while heating.

"Melt moldable" is having melt flowability.

"Having melt flowability" is having a temperature such that the melt flow rate would be from 0.1 to 1,000 g/10 min. at a temperature higher by 20° C. than the melting point of a resin under a load of 49 N.

"Melt flow rate" is a melt mass flow rate (MFR) stipulated in JIS K 7210: 1999 (ISO 1133: 1997).

"Carbonyl group-containing group" is a group having a carbonyl group (—C(=O)—) in its structure.

"Acid anhydride group" is a group represented by —C(=O)—O—C(=O)—.

"Units" are units formed by polymerization of monomers and derived from the monomers. Units may be units formed directly by a polymerization reaction or may be units of which a part of the units is converted to another structure by treating the polymer.

Laminate

The laminate to be produced by the process of the present invention has at least a fluorinated resin layer and heat resistant resin layers laminated on both surfaces of the fluorinated resin layer respectively. The laminate may have at least one another layer on a surface on an opposite side of the surface in contact with the fluorinated resin layer. Such another layer preferably contains a metal foil layer.

The laminate of the present invention is a laminate preferably used as a material of a printed board. The laminate for a printed board has at least a metal foil layer as another layer. Specifically, so called a flexible metal-clad laminate board to be used as a material for a flexible printed board is preferred.

The thickness of the laminate in the present invention is not particularly restricted, however, the thickness of the laminate is preferably from 10 to 2,500 µm, more preferably from 12 to 300 µm, further preferably from 18 to 150 µm, particularly preferably from 20 to 100 µm.

The thickness of the laminate as a flexible metal-clad laminate board is preferably from 12 to 300 µm, more preferably from 18 to 150 µm, further preferably from 20 to 100 µm.

The adhesive strength at an interface between the heat resistant resin layer and the fluorinated resin layer in the laminate is preferably at least 5 N/cm, more preferably at least 6 N/cm, further preferably at least 7 N/cm.

(Heat Resistant Resin Layer)

The heat resistant resin layer is a layer made of the after-mentioned heat resistant resin film which contains a heat resistant resin (except the after-mentioned fluorinated resin (A)) (hereinafter referred to also as "heat resistant resin (B)"). The heat resistant resin layer may contain an additive, etc.

The heat resistant resin layer may be a monolayer structure or a laminated structure of at least two layers.

The thickness of the heat resistant resin layer is preferably from 3 to 500 µm, more preferably from 5 to 200 µm, further preferably from 6 to 50 µm. When the thickness is at least the above lower limit value, the electric insulating property is excellent. When the thickness is at most the above upper limit value, the total thickness of the laminate is made to be thin.

The heat resistant resin (B) contained in the heat resistant resin layer may be one type or two or more types.

The content of the heat resistant resin (B) in the heat resistant resin layer is preferably at least 50 mass %, more preferably at least 80 mass %, in 100 mass % of the heat resistant resin layer, from the viewpoint of the heat resistance of the heat resistant resin layer. The upper limit of the content is not particularly restricted and may be 100 mass %.

Heat Resistant Resin (B):

The heat resistant resin (B) may, for example, be a polyimide (such as an aromatic polyimide), a polyarylate, a polysulfone, a polyarylsulfone (such as a polyether sulfone), an aromatic polyamide, an aromatic polyether amide, a polyphenylene sulfide, a polyaryl ether ketone, a polyamideimide or a liquid crystal polyester.

The heat resistant resin (B) is preferably a heat curable resin from the viewpoint of easily obtaining higher heat resistance.

The heat curable heat resistant resin (B) may, for example, be a heat curable polyimide, an epoxy resin or an acrylic resin. From the viewpoint of the electric properties, the heat curable polyimide is preferred.

The heat curable polyimide is preferably an aromatic polyimide. The aromatic polyimide is preferably a wholly aromatic polyimide to be produced by polycondensation of a polyvalent carboxylic acid dianhydride and an aromatic diamine.

The heat curable polyimide is usually obtained via a polyamic acid (a polyimide precursor) by a reaction (polycondensation) of a polyvalent carboxylic acid dianhydride (or its derivative) and a diamine.

Particularly, the aromatic polyimide has a rigid main chain structure and thereby is insoluble in a solvent, etc. and has an infusible property. Thus, first, a polyvalent carboxylic acid dianhydride and diamine are reacted to synthesis a polyimide precursor (polyamic acid or polyamide acid) which is soluble in an organic solvent, and at the stage of the polyamic acid, molding processing is carried out by various methods. Then, the polyamic acid is subjected to a dehydration reaction by heating or a chemical method so as to be cyclized (imidization) to form a polyimide.

As specific examples of the aromatic polyvalent carboxylic acid dianhydride, those mentioned in JP2012-145676A at paragraph [0055] may be mentioned.

Further, ethylenetetracarboxylic acid dianhydride and cyclopentane tetracarboxylic acid dianhydride which are non-aromatic polyvalent carboxylic acid dianhydride may be used similarly to the aromatic types. One type of the polyvalent carboxylic acid dianhydride may be used alone, or two or more types may be used in combination.

As specific examples of the aromatic diamine, those mentioned in JP2012-145676A at paragraph [0057] may be mentioned. One type of the aromatic diamine may be used alone, or two or more types may be used in combination.

Additive:

The additive to be contained in the heat resistant resin layer is preferably an inorganic filler having a low dielectric constant and a low dielectric loss tangent. The inorganic filler may, for example, be silica, clay, talc, calcium carbonate, mica, diatomaceous earth, alumina, zinc oxide, titanium oxide, calcium oxide, magnesium oxide, iron oxide, tin oxide, antimony oxide, calcium hydroxide, magnesium hydroxide, aluminum hydroxide, a basic magnesium carbonate, magnesium carbonate, zinc carbonate, barium carbonate, dawsonite, hydrotalcite, calcium sulfate, barium sulfate, calcium silicate, montmorillonite, bentonite, activated clay, sepiolite, imogolite, sericite, glass fiber, glass beads, silica type balloon, carbon black, carbon nanotube, carbon nanohorn, graphite, carbon fiber, glass balloon, carbon balloon, wood flour or zinc borate. One type of the inorganic filler may be used alone, two or more types may be used in combination.

The inorganic filler may be porous or nonporous, and from the viewpoint of a further low dielectric constant and a further low dielectric tangent, the porous is preferred.

The inorganic filler may be subjected to surface treatment with a finishing agent such as a silane coupling agent or a titanate coupling agent to improve the dispersability in a resin.

In the case of containing the inorganic filler, the content of the inorganic filler is preferably from 0.1 to 100 parts by mass, more preferably from 0.1 to 60 parts by mass per 100 parts by mass of the heat resistant resin (B).

(Fluorinated Resin Layer)

The fluorinated resin layer is a layer made of the after-mentioned fluorinated resin film and comprises a specific fluorinated resin (hereinafter referred to also as "fluorinated resin (A)"). The fluorinated resin layer may contain another resin, an additive, etc. The fluorinated resin layer may be a monolayer structure or a laminated structure having two or more layers.

The thickness of the fluorinated resin layer is preferably from 1 to 1,000 µm and from the viewpoint of soldering iron heat resistance, preferably from 1 to 20 µm, more preferably from 3 to 20 µm, particularly preferably from 3 to 15 µm. When the thickness is at most the above upper limit value, the total thickness of a laminate is made to be thin. When the thickness is at least the above lower limit value, the blister (bubbling) of the fluorinated resin due to heat tends not to result, when the fluorinated resin is exposed to atmosphere at reflow of soldering iron at a high temperature. Further, the fluorinated resin layer is excellent in an insulating property.

The fluorinated resin (A) contained in the fluorinated resin layer may be one type or two or more types.

The content of the fluorinated resin (A) in the fluorinated resin layer is preferably at least 50 mass %, more preferably at least 80 mass %, in 100 mass of the fluorinated resin layer from the view point of the adhesive strength at an interface between the fluorinated resin layer and an adjacent layer thereto. The upper limit of the content is not particularly restricted and may be 100 mass %.

Fluorinated Resin (A):

The fluorinated resin (A) is a fluorinated resin having at least one functional group (hereinafter referred to as "functional group (I)") selected from the group consisting of a carbonyl group-containing group, a hydroxy group, an epoxy group and an isocyanate group. The fluorinated resin (A) has the functional groups (I), whereby the adhesive strength at an interface between the fluorinated resin layer containing the fluorinated resin (A) and an adjacent layer thereto becomes high.

From the viewpoint of the adhesive strength at an interface between the fluorinated resin layer and an adjacent layer thereto, the fluorinated resin (A) has the functional group (I) at either one or both of a terminal group of the main chain and a pendant group of the main chain. The functional groups (I) may be one type or two or more types.

From the viewpoint of the adhesive strength at an interface between the fluorinated resin layer and an adjacent layer thereto, the fluorinated resin (A) preferably has at least a carbonyl group-containing group as the functional group (I).

The carbonyl group-containing group may, for example, be a group having a carbonyl group between carbon atoms of a hydrocarbon group, a carbonate group, a carboxy group, a haloformyl group, an alkoxy carbonyl group or an acid anhydride group.

The hydrocarbon group in the group having a carboyl group between carbon atoms of the hydrocarbon group may, for example, be a $C_{2-8}$ alkylene group. Further, the carbon number of the alkylene group is a carbon number in the state of having no carbonyl group. The alkylene group may be linear or branched.

The haloformyl group is represented by —C(=O)—X (wherein X is a halogen atom). The halogen atom in the haloformyl group may, for example, a fluorine atom or a chlorine atom and is preferably a fluorine atom. That is, the haloformyl group is preferably a fluoroformyl group (also referred to as "carbonyl fluoride group").

The alkoxy group in the alkoxy carbonyl group may be linear or branched. A $C_{1-8}$ alkoxy group is preferred, and a methoxy group or an ethoxy group is particularly preferred.

The content of the functional groups (I) in the fluorinated resin (A) is preferably from 10 to 60,000 groups, more preferably from 100 to 50,000 groups, further preferably from 100 to 10,000 groups, particularly preferably from 300 to 5,000 groups, per the carbon number of $1\times10^6$ of the main chain in the fluorinated resin (A). When the content is at least the above lower limit value, the adhesive strength at an interface between the fluorinated resin layer and an adjacent layer thereto becomes further high. When the content is at most the above upper limit value, even though the temperature of thermal lamination is low, the adhesive strength at an interface between the fluorinated resin layer and an adjacent layer thereto is high.

The content of the functional groups (I) can be measured by a method such as nuclear magnetic resonance (NMR) analysis or infrared absorption spectrum analysis. For example, as described in JP2007-314720A, the proportion (mol %) of construction units having the functional groups (I) in all construction units constituting the fluorinated resin (A) is obtained by the infrared absorption spectrum analysis or the like, and the content of the functional groups (I) can be calculated from the proportion.

The melting point of the fluorinated resin (A) is preferably from 260 to 320° C., more preferably from 295 to 315° C., further preferably from 295 to 310° C. When the melting point is at least the above lower limit value, the fluorinated resin layer is excellent in heat resistance. When the melting point is at most the above upper limit value, the fluorinated resin (A) is excellent in moldability.

The melting point of the fluorinated resin (A) can be adjusted by the type or the proportion of construction units constituting the fluorinated resin (A), the molecular weight of the fluorinated resin (A) or the like. For example, the larger the proportion of the after-mentioned units (u1) is, the higher the melting point is.

As the fluorinated resin (A), a melt moldable one is used from the viewpoint of easily produce the after-mentioned fluorinated resin film.

The melt moldable fluorinated resin (A) may, for example, be a known melt moldable fluorinated resin (such as a tetrafluoroethylene/fluoroalkyl vinyl ether copolymer, a tetrafluoroethylene/hexafluoropropylene copolymer, an ethylene/tetrafluoroethylene copolymer, a polyvinylidene fluoride, a polychlorotrifluoroethylene or an ethylene/chlorotrifluoroethylene copolymer) in which the functional group (I) is introduced, and for example, the after-mentioned fluorinated polymer ($\alpha$1) may be mentioned.

The fluorinated resin (A) is preferably one having a melt flow rate of from 0.1 to 1,000 g/10 min (preferably from 0.5 to 100 g/10 min, more preferably from 1 to 30 g/10 min, further preferably from 5 to 20 g/10 min) at a temperature higher by 20° C. than the melting point of the fluorinated resin (A) under a condition of a load of 49 N. When the melt flow rate is at least the above lower limit value, the fluorinated resin (A) is excellent in the moldability, and the fluorinated resin layer is excellent in the surface smoothness and the outer appearance. When the melt flow rate is at most the above upper limit value, the fluorinated resin layer is excellent in the mechanical strength.

The melt flow rate of the fluorinated resin (A) at 372° C. undr a load of 49 N is preferably from 0.5 to 15 g/10 min, more preferably from 1 to 15 g/10 min, further preferably from 1 to 12 g/10 min. When the melt flow rate is at most the above upper limit value, the soldering iron heat resistance tends to improve. When the melt flow rate is at least the above lower limit value, the fluorinated resin (A) is excellent in moldability.

The melt flow rate is an index of the molecular weight of the fluorinated resin (A). The higher the melt flow rate is, the smaller the molecular weight is, and the lower the melt flow rate is, the larger the molecular weight is. The molecular weight of the fluorinated resin (A), namely the melt flow rate, can be adjusted by conditions for producing the fluorinated resin (A). For example, if the polymerization time at the time of polymerizing monomers is shorten, the melt flow rate tends to be high. In order to lower the melt flow rate, a method of subjecting the fluorinated resin (A) to heat treatment so as to form a crosslinked structure, whereby the molecular weight is increased, a method of reducing the amount of a radical polymerization initiator for producing the fluorinated resin (A), etc. may be mentioned.

Depending on the difference in the production process, the following fluorinated resins (A) may be mentioned.

($\alpha$) A fluoropolymer having functional groups (I) derived from at least one member selected from the group consisting of monomers used for producing a polymer, a chain transfer agent and a polymerization initiator.

($\beta$) A fluorinated resin wherein functional groups (I) is introduced into a fluorinated resin having no functional group (I) by a surface treatment such as corona discharge treatment or plasma treatment.

($\gamma$) A fluorinated resin obtained by graft polymerizing a monomer having a functional group (I) to a fluorinated resin having no functional group (I).

The fluorinated resin (A) is preferably the fluoropolymer ($\alpha$) because of the following reason.

The fluoropolymer ($\alpha$) has the functional group (I) at an either one or both of the terminal group of the main chain of the fluoropolymer ($\alpha$) or a pendant group, whereby the adhesive strength at an interface between the fluorinated resin layer and an adjacent layer thereto becomes further high.

The functional groups (I) in the fluorinated resin ($\beta$) are unstable, since its functional group (I) is formed by surface treatment, and thereby the functional groups (I) are likely to disappear over time.

In a case where the functional groups (I) in the fluoropolymer ($\alpha$) are derived from monomers used for producing the fluoropolymer ($\alpha$), the fluoropolymer ($\alpha$) can be produced by the following method (1). In such a case, the functional groups (I) are present in units derived from the monomers and formed by the polymerization of the monomers at the time of the production.

Method (1): at the time of polymerizing monomers to produce the fluoropolymer ($\alpha$), monomers having a functional group (I) are used.

In a case where the functional groups (I) in the fluoropolymer ($\alpha$) are derived from a chain transfer agent used for producing the fluoropolymer ($\alpha$), the fluoropolymer ($\alpha$) can be produced by the following method (2). In such a case, the functional groups (I) are present as terminal groups of the main chain of the fluoropolymer ($\alpha$).

Method (2): the fluoropolymer ($\alpha$) is produced by polymerizing monomers in the presence of a chain transfer agent having a functional group (I).

The chain transfer agent having the functional group (I) may, for example, be acetic acid, acetic acid anhydride, methyl acetate, ethylene glycol or propylene glycol.

In a case where the functional groups (I) in the fluoropolymer ($\alpha$) are derived from a polymerization initiator used for producing the fluoropolymer ($\alpha$), the fluoropolymer ($\alpha$) can be produced by the following method (3). In such a case, the functional groups (I) are present as terminal groups of the main chain of the fluoropolymer ($\alpha$).

Method (3): monomers are polymerized in the presence of a polymerization initiator such as a radical polymerization initiator having the functional group (I) to produce the fluoropolymer ($\alpha$).

The radical polymerization initiator having the functional group (I) may, for example, be di-n-propyl peroxydicarbonate, diisopropyl peroxycarbonate, tert-butyl peroxyisopropylcarbonate, bis(4-tert-butylcyclohexy) peroxydicarbonate or di-2-ethylhexyl peroxydicarbonate.

In a case where the functional groups (I) in the fluoropolymer ($\alpha$) are derived from at least two members of the monomers, the chain transfer agent and the polymerization initiator which are used for producing the fluoropolymer (α), the fluoropolymer (α) can be produced by combining at least two of the above methods (1) to (3).

The fluoropolymer (α) is preferably the fluoropolymer (α) having the functional groups (I) derived from the monomers, which is produced by the method (1), since the content of the functional groups (I) can be easily controlled, and thereby the adhesive strength with the adjacent layer is easily controlled.

Fluoropolymer (α1):

The fluoropolymer (α) having the functional groups (I) derived from the monomers is particularly preferably the following fluoropolymer (α1), since the adhesive strength at an interference between the fluorinated resin layer and an adjacent layer thereto is further high.

Fluoropolymer (α1) having units (u1) derived from tetrafluoroethylene (hereinafter referred to also as "TFE"), units (u2) derived from cyclic hydrocarbon monomers having an acid anhydride group (hereinafter also referred to as "acid anhydride group-containing cyclic hydrocarbon monomer") and units (u3) derived from fluorinated monomers (except TFE).

Here, the acid anhydride groups in the units (u2) correspond to the functional groups (I).

The acid anhydride group-containing cyclic hydrocarbon monomer which constitutes the units (u2) may, for example, be itaconic acid anhydride (hereinafter referred to also as "IAH"), citraconic acid anhydride (hereinafter referred to also as "CAH"), 5-norbornene-2,3-dicarboxylic acid anhydride (hereinafter referred to also as "NAH") or maleic acid anhydride. One type of the acid anhydride group-containing cyclic hydrocarbon monomer may be solely used, or two or more types may be used in combination.

The acid anhydride group-containing cyclic hydrocarbon monomer is preferably at least one member selected from the group consisting of IAH, CAH and NAH. In such a case, a fluoropolymer (α1) having acid anhydride groups can be easily produced without employing a specific polymerization method (JPH11-193312A) required in a case where maleic acid anhydride is used.

The acid anhydride group-containing cyclic hydrocarbon monomer is preferably NAH, since the adhesive strength at an interface between the fluorinated resin layer and an adjacent layer thereto becomes further high.

The fluorinated monomer constituting the units (u3) is preferably a fluorinated compound having one polymerizable carbon-carbon double bond and may, for example, be a fluoroolefin (such as vinyl fluoride, vinylidene fluoride (hereinafter referred to also as "VdF"), trifluoroethylene, chlorotrifluoroethylene (hereinafter referred to also as "CTFE"), hexafluoropropylene (hereinafter referred to also as "HFP"), except TFE), $CF_2=CFOR^{f1}$ (wherein $R^{f1}$ is a $C_{1-10}$ perfluoroalkyl group which may have an oxygen atom between carbon atoms), $CF_2=CFOR^{f2}SO_2X^1$ (wherein $R^{f2}$ is a $C_{1-10}$ perfluoroalkylene group which may have an oxygen atom between carbon atoms, and $X^1$ is a halogen atom or a hydroxy group), $CF_2=CFOR^{f3}CO_2X^2$ (wherein $R^{f3}$ is a $C_{1-10}$ perfluoroalkylene group which may have an oxygen atom between carbon atoms, and $X^2$ is a hydrogen atom or a $C_{1-3}$ alkyl group), $CF_2=CF(CF_2)_pOCF=CF_2$ (wherein p is 1 or 2), $CH_2=CX^3(CF_2)_qX^4$ (wherein $X^3$ is a hydrogen atom or a fluorine atom, q is an integer of from 2 to 10, and $X^4$ is a hydrogen atom or a fluorine atom), or perfluoro(2-methylene-4-methyl-1,3-dioxolan).

The fluorinated monomer is preferably at least one member selected from the group consisting of VdF, CTFE, HFP, $CF_2=CFOR^{f1}$ and $CH_2=CX^3(CF_2)_qX^4$, more preferably $CF_2=CFOR^{f1}$ or HFP.

$CF_2=CFOR^{f1}$ may, for example, be $CF_2=CFOCF_2CF_3$, $CF_2=CFOCF_2CF_2CF_3$ (hereinafter referred to also as "PPVE"), $CF_2=CFOCF_2CF_2CF_2CF_3$ or $CF_2=CFO(CF_2)_8F$, and PPVE is particularly preferred.

$CH_2=CX^3(CF_2)_qX^4$ may, for example, be $CH_2=CH(CF_2)_2F$, $CH_2=CH(CF_2)_3F$, $CH_2=CH(CF_2)_4F$, $CH_2=CF(CF_2)_3H$ or $CH_2=CF(CF_2)_4H$, and $CH_2=CH(CF_2)_4F$ or $CH_2=CH(CF_2)_2F$ is preferred.

The proportion of the units (u1) is preferably from 50 to 99.89 mol %, more preferably from 50 to 99.4 mol %, further preferably from 50 to 98.9 mol %, in 100 mol % of the units (u1), the units (u2) and the units (u3) in total.

The proportion of the units (u2) is preferably from 0.01 to 5 mol %, more preferably from 0.1 to 3 mol %, further preferably from 0.1 to 2 mol %, in 100 mol % of the units (u1), the units (u2) and the units (u3) in total.

The proportion of the units (u3) is preferably from 0.1 to 49.99 mol %, more preferably from 0.5 to 49.9 mol %, further preferably from 1 to 49.9 mol %, in 100 mol % of the units (u1), the units (u2) and the units (u3) in total.

When the proportions of the respective units fall within the above ranges, the fluorinated resin layer is excellent in the heat resistance, the chemical resistance and the elasticity at a high temperature.

When the proportion of the units (u2) falls within the above range, the amount of acid anhydride groups in the fluoropolymer (α1) is appropriate, and the adhesive strength at an interface between the fluorinated resin layer and an adjacent layer thereto becomes further high.

When the proportion of the units (u3) falls within the above range, the fluoropolymer (α1) is excellent in the moldability, and the fluorinated resin layer is excellent in the flex resistance.

The proportions of the respective units can be calculated by the melt NMR analysis of the fluoropolymer (α1), the fluorine content analysis, the infrared absorption spectrum analysis or the like.

In a case where the fluoropolymer (α1) is consisting of the units (u1), the units (u2) and the units (u3), what the proportion of the units (u2) is 0.01 mol % corresponds to that the content of acid anhydride groups in the fluoropolymer (α1) is 100 groups per the carbon number of the main chain of the fluoropolymer (α1) of $1\times10^6$. What the proportion of the units (u2) is 5 mol % corresponds to the content of acid anhydride groups in the fluoropolymer (α1) is 50,000 groups per the carbon number of the main chain of the fluoropolymer (α1) of $1\times10^6$.

A part of acid anhydride groups in the units (u2) is hydrolyzed in some cases, and as a result, the fluoropolymer (α1) sometimes contains units derived from dicarboxylic acids (such as itaconic acid, citraconic acid, 5-norbornene-2,3-dicarboxylic acid or maleic acid) corresponding to the acid anhydride group-containing cyclic hydrocarbon monomers. In a case where the fluoropolymer (α1) contains units derived from the dicarboxylic acids, the proportion of such units is included in the proportion of the units (u2).

The fluoropolymer (α1) may have units (u4) derived from non-fluorinated monomers (except the acid anhydride-containing cyclic hydrocarbon monomer) in addition to the units (u1) to (u3).

The non-fluorinated monomer is preferably a non-fluorinated compound having one polymerizable carbon-carbon double bond, and such a monomer may, for example, be an olefin (such as ethylene or propylene) having the carbon number of at most 3 or a vinyl ester (such as vinyl acetate). One type of the non-fluorinated monomer may be solely used, or two or more types may be used in combination.

The non-fluorinated monomer is preferably ethylene, propylene or vinyl acetate, particularly preferably ethylene.

In a case where the fluoropolymer ($\alpha$1) has the units (u4), the proportion of the units (u4) is preferably from 5 to 90 mol %, more preferably from 5 to 80 mol %, further preferably from 10 to 65 mol %, per 100 mol % of the total of the units (u1), the units (u2) and the units (u3).

When the total of all units in the fluoropolymer ($\alpha$1) is 100 mol %, the total of the units (u1), the units (u2) and the units (u3) is preferably at least 60 mol %, more preferably at least 65 mol %, more preferably at most 68 mol %. The preferred upper limit value is 100 mol %.

As preferred examples of the fluoropolymer ($\alpha$1), a TFE/PPVE/NAH copolymer, a TFE/PPVE/IAH copolymer, a TFE/PPVE/CAH copolymer, a TFE/HFP/IAH copolymer, a TFE/HFP/CAH copolymer, a TFE/VdF/IAH copolymer, a TFE/VdF/CAH copolymer, a TFE/CH$_2$=CH(CF$_2$)$_4$F/IAH/ethylene copolymer, a TFE/CH$_2$=CH(CF$_2$)$_4$F/CAH/ethylene copolymer, a TFE/CH$_2$=CH(CF$_2$)$_2$F/IAH/ethylene copolymer, a TFE/CH$_2$=CH(CF$_2$)$_2$F/CAH/ethylene copolymer, etc. may be mentioned. A fluorinated resin (A) can be produced by a conventional method.

Another Resin:

Another resin to be contained in the fluorinated resin layer is not particularly restricted, so long as the property of the electric reliability is not impaired. Such another resin may, for example, be a fluorinated resin other than the fluorinated resin (A), an aromatic polyester, a polyamideimide or thermoplastic polyimide.

Such another resin is preferably a fluorocopolymer other than the fluorinated resin (A), from the viewpoint of the electric reliability.

The fluorinated resin other than the fluorinated resin (A) may, for example, be a tetrafluoroethylene/fluoroalkyl vinyl ether copolymer, a tetrafluoroethylene/hexafluoropropylene copolymer or an ethylene/tetrafluoroethylene copolymer.

The melting point of the fluorinated resin other than the fluorinated resin (A) is preferably from 280 to 320° C. When the melting point falls within the above range, the fluorinated resin layer is suppressed from blistering (bubbling) due to heat when being exposed to atmosphere corresponding to soldering reflow.

Additive:

The additive to be contained in the fluorinated resin layer may be the same one contained in the heat resistant resin layer, and the preferred embodiment is also same.

(Metal Foil Layer)

The metal foil layer is a layer made of a metal foil.

The metal foil is not particularly restricted and appropriately selected depending on the application of a laminate. For example, in a case where the laminate is used in an electronic instrument or an electrical apparatus, as the metal foil, a foil made of copper or a copper alloy, a foil made of stainless steel, a foil made of nickel or a nickel alloy (also including 42 alloy) and a foil made of aluminum and an aluminum alloy may be mentioned. A copper foil such as a rolled copper foil or an electrolytic copper foil is used in conventional laminates to be used in electronic equipment and electrical apparatus in many cases, and the copper foil is also preferred in the present invention.

A corrosion protection layer (an oxide coating film such as chromate) or a heat-resistant layer may be formed on the surface of the metal foil. Further, in order to improve the adhesive strength between the metal foil and an adhesive layer, a coupling agent treatment or the like may be applied on the surface of the metal foil.

The thickness of the metal foil is not particularly restricted, so long as sufficient functions are obtained depending on applications of the laminate, however, the thickness is preferably from 6 to 70 μm, more preferably from 9 to 35 μm.

(Adhesive Layer)

In a case where the laminate of the present invention has a metal foil layer at the outside of the heat resistant resin layer, the metal foil layer and the heat resistant layer are preferably bonded via an adhesive layer.

As the adhesive layer, a fluorinated resin layer containing the above fluorinated resin (A) may, for example, be used. Otherwise, a layer made of a known adhesive material (such as an epoxy resin or an acrylic resin) in the field of the flexible metal-clad laminate plate may be used.

The adhesive layer is preferably a layer made of the after-mentioned fluorinated resin film containing the fluorinated resin (A), since the electric properties are excellent, and the adhesive strength is excellent. In such a case, in one laminate, the fluorinated resin film to be used for bonding heat resistant resin layers each other may be the same as the fluorinated resin film to be used for bonding the heat resistant resin layer and the metal foil layer, or they may be different.

Process for Producing Laminate

The process for producing a laminate of the present invention has at least the following preliminary heating step and thermal lamination step.

Preliminary heating step: A step of heating, while conveying without pressing in the thickness direction (lamination direction), a temporary laminate wherein heat resistant resin films containing the heat resistant resin (B) are laminated on both surfaces of a fluorinated resin film containing the fluorinated resin (A).

In the temporary laminate, the fluorinated resin film and the heat resistant resin films are laminated so as to closely attach one another under the state that tension is applied in the lengthwise direction, and they are not press-bonded.

Thermal lamination step: After the preliminary heating step, a step of pressing the temporary laminate in the thickness direction (lamination direction), while heating it at a thermal lamination temperature of at least the melting point of the fluorinated resin (A) and at most 420° C., for bonding, (press bonding).

(Fluorinated Resin Film)

The fluorinated resin film may be one containing the fluorinated resin (A). The fluorinated resin film may be a monolayer film or may be a laminated film. The thickness of the fluorinated resin film is preferably from 1 to 1,000 μm, more preferably from 1 to 20 μm, further preferably from 3 to 20 μm, particularly preferably from 3 to 15 μm.

For example, the fluorinated resin film can be obtained by the following method.

A method of molding the fluorinated resin (A) itself or a resin composition containing the fluorinated resin (A) by a conventional molding method (such as an extrusion molding method or an inflation molding method).

A method of applying a conventional surface treatment such as corona discharge treatment or plasma treatment to a fluorinated resin having no functional group (I) to introduce functional groups (I).

Before forming a temporary laminate, the fluorinated resin film may be preliminary subjected to heat treatment at a temperature of at least 100° C. and less than 250° C., (preferably at least 150° C. and less than 250° C., more preferably at least 180° C. and less than 250° C.). By preliminary applying the heat treatment, the shrinkage of the fluorinated resin film at the preliminary heating step and the thermal lamination step is made to be small, and as a result, the warpage of the temporary laminate can be reduced.

(Heat Resistant Resin Film)

The heat resistant resin film may be one containing the heat resistant resin (B) and may be a monolayer film or a laminated film. The thickness of the heat resistant resin film is preferably from 3 to 500 µm, more preferably from 5 to 200 µm, further preferably from 6 to 50 µm.

The heat resistant resin film can be obtained by a method of molding the heat resistant resin (B) itself or a resin composition containing the heat resistant resin (B) into a film form by a conventional molding method (such as an extrusion molding method or an inflation molding method).

(Thermal Lamination Step)

The thermal lamination step is preferably continuously carried out by means of e.g. a thermal lamination apparatus provided with at least one pair of thermal lamination means. The thermal lamination means is a means of pressing the temporary laminate while heating for press bonding. As the thermal lamination means, a thermal roll lamination apparatus provided with at least one pair of metal rolls may be suitably used.

In the thermal roll lamination apparatus, when a temporary laminate passes between a pair of metal rolls heated to the predetermined temperature, the temporary laminate is in contact with the metal rolls, thereby heated and pressed in the film thickness direction for press bonding. The thermal lamination apparatus may have a structure such that a temporary laminate passes through plural pairs of metal rolls in order. As the structure of one pair of the metal rolls for thermal lamination, a conventional structure may be appropriately employed.

The surface temperature (the thermal lamination temperature) of the metal rolls for pressing the temporary laminate is at least the melting point of the fluorinated resin (A), preferably at least 350° C., more preferably at least 380° C., further preferably from 400° C. When the thermal lamination temperature is at least the above lower limit value, good adhesive strength is obtained, and peeling tends not to result.

In a case where the heat resistant resin film is a thermoplastic resin film, the thermal lamination temperature is less than the decomposition temperature of the thermoplastic resin. In a case where the heat resistant resin film is a heat curable resin film, the upper limit of the thermal lamination temperature is not particularly restricted, however, the upper limit is preferably at most 420° C. as the upper limit of specifications of a general lamination apparatus.

The pressure between a pair of metal rolls for pressing the temporary laminate (thermal lamination pressure) is preferably from 49 to 1,764 N/cm, more preferably from 98 to 1,470 N/cm as a roll linear pressure represented by a load applied per 1 cm width of a roll. When the thermal lamination pressure is at most the above upper limit value, a film is not likely to be cut at the time of the thermal lamination, and when the thermal lamination temperature is at least the above lower limit value, good adhesive strength can be obtained, and peeling is not likely to result.

The running rate of the temporary laminate at the time of passing between a pair of metal rolls (thermal lamination rate) is preferably at least 0.5 m/min, more preferably at least 1.0 m/min. When the thermal lamination rate is at least 0.5 m/min, the thermal lamination can be sufficiently carried out. When the thermal lamination rate is at least 1.0 m/min, the productivity is more improved.

The thermal lamination rate may be within the range such that thermal lamination is possible. By appropriately lowering the thermal lamination rate, the adhesive strength can be improved. For example, the thermal lamination rate is preferably at most 10 m/min, more preferably at most 8 m/min.

(Preliminary Heating Step)

The preliminary heating step is carried out by a method of heating the temporary laminate being conveyed to a thermal lamination means without pressing in the lamination direction (the thickness direction) before press bonding.

The preliminary heating means may be a contact type of making the temporary laminate be in contact with a heat source or a non-contact type of heating the temporary laminate without being in contact with a heat source. The contact type is preferred, since the films constituting the temporary laminate are easily closely attached. For example, preferred is a method that the temporary laminate being in contact with metal rolls is conveyed.

The temperature (preliminary heating temperature) of the temporary laminate immediately before pressed in the thermal lamination step is preferably at least the temperature lower by 20° C. than the melting point of the fluorinated resin (A) (melting point −20° C.), more preferably at least the temperature lower by 10° C. than the melting point of the fluorinated resin (A) (melting point −10° C.), particularly preferably at least the melting point of the fluorinated resin (A). The preliminary heating temperature is preferably at most the thermal lamination temperature. When the preliminary heating temperature falls within the above range, the shrinkage and cut of the fluorinated resin film can be appropriately prevented.

In the preliminary heating step, the temporary laminate may be continuously heated or may be intermittently heated. The conveying time (preliminary heating time) of from the moment when the temporary laminate is at the position of initiating preliminarily heating to immediately before the temporary laminate presses in the thermal lamination step, is preferably from 3 to 60 seconds, more preferably from 5 to 40 seconds, further preferably from 10 to 30 seconds. When the preliminary heating time is at least the above lower limit, the adhesive strength is excellent, and when the preliminary heating time is at most the above upper limit, the shrinkage and cut of the fluorinated resin film can be appropriately prevented.

In a case where the preliminary heating step is carried out by means of a contact type preliminary heating means, when the preliminary heating time falls within the above range, the temperature of the temporary laminate is the same temperature as the surface temperature of a heat source to be in contact with the temporary laminate.

(First Mode)

FIG. 1 is a schematic configuration view illustrating a first mode of a thermal roll lamination apparatus to be preferably used in the process for producing a laminate of the present invention.

In FIG. 1, 1 is a fluorinated resin film, and 2 is a heat resistant resin film. A thermal roll lamination apparatus 10 is provided with metal rolls 31 and 32 for thermal lamination for carrying out the thermal lamination and a metal roll 33 for heating for carrying out the preliminary heating at a stage prior to the metal rolls 31 and 32. In FIG. 11 to 13 are delivery rolls, 21 to 25 are conveyer rolls, and 26 is a wind-up roll for winding the thermal laminated laminate.

In the thermal roll lamination apparatus 10 of the mode of the present invention, a long fluorinated resin film 1 continuously delivered from a deliver roll 11 runs between long heat resistant resin films 2 and 2 continuously delivered from deliver rolls 12 and 13 respectively, they are laminated at a first conveyer roll 21, and thereby a temporary laminate is formed. The temporary laminate is delivered to the metal roll 33 for heating via the second to fifth conveyer rolls 22, 23, 24 and 25 in this order. Then, the temporary laminate is conveyed while being in contact with a part of the periphery of the metal roll for heating 33, and the temporary laminate is conveyed while being in contact with a part of the periphery of the other metal roll 32 for thermal lamination. Then, pressure is applied in the thickness direction, when the temporary laminate passes between a pair of the metal rolls 31 and 32 for thermal lamination.

The surface temperature of the metal roll 33 for heating is controlled to the predetermined heating temperature, and the surface temperature of the metal rolls 31 and 32 for thermal lamination is controlled to the predetermined thermal lamination temperature.

The temporary laminate delivered to the metal roll 33 for heating is made to be in contact with the periphery of the metal roll 33 for heating and thereby heated, and then is made to be in contact with the periphery of the metal roll 32 for thermal lamination and thereby also heated. When the temporary laminate passes between the metal roll 33 for heating and the metal roll 32 for thermal lamination, pressure is not applied in the thickness direction, and press bonding is not carried out there. The temporary laminate preliminary heated thus is press bonded at the time of passing between a pair of the metal rolls 31 and 32 for thermal lamination, and thereby a thermally laminated laminate is formed. The obtained laminate is continuously rolled up by a wind-up roll 26.

In this mode, the preliminary heating step is from the moment when the temporary laminate is brought in contact with the periphery of the metal roll 33 for heating to the moment immediately before the temporary laminate passes between a pair of the metal rolls 31 and 32 for thermal lamination.

In this mode, the surface temperature of the metal roll 33 for heating is preferably the same as or lower than the surface temperature of the metal rolls 31 and 32 for thermal lamination. The absolute value of the difference in the temperature between them is preferably from 0 to 100° C., more preferably from 0 to 50° C.

The temporary laminate may have non-heated time that the temporary laminate is not in contact with any metal roll when passing between the metal roll 33 for heating and the metal roll 32 for thermal lamination. That is, the temporary laminate may be intermittently heated. The non-heated time is preferably time such that the temperature of the temporary laminate heated by the metal roll 33 for heating is not lowered. For example, one time of the non-heated time is preferably at most 10 seconds, more preferably at most 3 seconds, further preferably at most 1 second.

(Subsequent Step)

In a case where the laminate is warped in the thermal lamination step, a step of reforming the warpage of the laminate may be provided.

Reforming the warpage is carried out by subjecting the laminate to heat treatment at a temperature of from 100 to 250° C. (preferably from 150 to 250° C., more preferably from 180 to 250° C.).

Further, in order to improve the soldering iron heat resistance of the laminate, the laminate may be subjected to heat treatment so as to lower the melt flow rate of the fluorinated resin (A). The temperature of the heat treatment is preferably at least 370° C., more preferably at least 380° C.

Further, by subjecting the laminate to heat treatment under a low oxygen concentration environment such as an inert gas atmosphere such as nitrogen or argon, under reduced pressure or under vacuum condition at at least the melting point of the fluorinated resin, the size stability of the after mentioned flexible printed board in a soldering iron reflow step or other heat treatment steps (such as coverlay attachment) can be improved. The heat treatment condition is preferably from 5 seconds to 48 hours (the melting point of the fluorinated resin (A)+from at least 10° C. to at most 120° C.), more preferably from 30 seconds to 36 hours (the melting point of the fluorinated resin (A)+from at least 30° C. to at most 100° C.), further preferably from 1 minute to 24 hours (the melting point of the fluorinated resin (A)+from at least 40° C. to at most 80° C.). Further, by the heat treatment, the adhesive strength at an interface between the fluorinated resin layer and the heat resistant resin film is improved. In a case where the heat treatment is applied, even though the thermal lamination pressure in the thermal lamination step is lowered, a laminate having a sufficiently high adhesive strength at the interface can be obtained. Further, if the thermal lamination pressure is too high, the size stability of the laminate and the after-mentioned flexible printed board tends to deteriorate, however, in the case of the heat treatment, the thermal lamination pressure can be lowered to improve the size stability.

(Second Mode)

In the first mode, the metal roll 33 for heating is provided at the prior stage to a pair of the metal rolls 31 and 32 for thermal lamination, and the preliminary heating step is from the moment when the temporary laminate is brought in contact with the periphery of the metal roll 33 for heating to the moment immediately before the temporary laminate passes between a pair of the metal rolls 31 and 32 for thermal lamination, however, the present invention may have a construction having no metal roll 33 for heating.

For example, the metal roll 33 for heating is replaced by a conveyer roll, and the preliminary heating step may be from the moment when the temporary laminate is brought in contact with the periphery of the metal roll 32 for thermal lamination to the moment immediately before the temporary laminate passes between the pair of the metal rolls 31 and 32 for thermal lamination.

In either mode, preliminary heating is carried out before press bonding the temporary laminate, whereby the effect to suppress the shrinkage and the cut of the fluorinated resin film at the time of press bonding can be obtained.

The first mode is more preferred than the second mode, since the first mode has the metal roll 33 for heating, whereby the time of the preliminary heating step can be prolonged.

(Third Mode: Process for Producing Laminate Having Metal Foil Layer)

In the first or the second mode, a laminate having three layers wherein heat resistant resin layers are laminated on both surfaces of a fluorinated resin layer respectively, is produced, however, a laminate having seven layers wherein metal foil layers are laminated on surfaces on an opposite side of the surface in contact with the fluorinated resin layer, of the heat resistant resin layers via adhesive layers respectively, can also be produced.

For example, in FIG. 1, two rolls for delivering a long metal foil and two rolls for delivering a long adhesive material film (such as the same film as the fluorinated resin film 1) are added, and at the first conveyer roll 21, a metal foil, an adhesive material film, a heat resistant resin film 2, a fluorinated resin film 1, a heat resistant resin film 2, an adhesive material film and a metal foil are laminated in this order from the top to form a temporary laminate having seven layers. The subsequent steps are carried out in the same manner as in the first or the second mode, whereby a laminate having the press bonded seven layers can be obtained.

Otherwise, in the first or the second mode, by the method of using a laminated film having a heat resistant resin layer and a metal foil preliminarily laminated via an adhesive layer, instead of the heat resistant resin films 2 and 2, a laminate having a metal foil layer, an adhesive layer, a heat resistant resin layer, a fluorinated resin layer, a heat resistant resin layer, an adhesive layer and a metal foil layer which are laminated in this order from the top, can be produced.

In the above described process for producing a laminate of the present invention, a temporary laminate wherein heat resistant resin films are laminated on both surfaces of a fluorinated resin film is preliminary heated before thermal lamination, and thereby the temporary laminate is thermally laminated in the state that both surfaces of the soften fluorinated resin film is closely attached with the heat resistant resin films, whereby even though the thermal lamination is carried out at a temperature higher than the melting point of the fluorinated resin (A), the fluorinated resin film is not likely to heat shrink in the width direction and is difficult to be cut.

Accordingly, a laminate having the structure that both surfaces of a fluorinated resin layer are laminated with heat resistant resin layers can be stably produced by thermal lamination.

Process for Producing Printed Board

By employing the process for producing a laminate of the present invention, a laminate having a metal foil layer is produced, and a printed board can be produced via a step of etching the metal foil layer to remove unnecessary portions in the laminate to form a patterned circuit. For example, a laminate having a metal foil layer can be produced by the third mode. The printed board in the present invention may be provided with various miniaturized and densified components.

EXAMPLES

Now, the present invention will be described in further detail with reference to Examples. However, it should be understood that the present invention is by no means restricted to such specific Examples.

(Copolymer Composition)

The copolymer composition of the fluorinated resin (A) was obtained by the melt NMR analysis, the fluorine content analysis and the infrared spectrum analysis.

(Content of Functional Groups (I))

The proportion of units derived from NAH having the functional groups (I) in the fluorinated resin (A) was obtained by the following infrared absorption spectrum analysis.

The fluorinated resin (A) was press-molded to obtain a film having a thickness 200 μm. In the infrared absorption spectrum, the absorption peak of units derived from NAH in the fluorinated resin (A) arises at 1,778 cm$^{-1}$. The absorbance of the absorption peak was measured, and using the molar absorption coefficient of NAH of 20,810 mol$^{-1}$·l·cm$^{-1}$, the proportion (mol %) of the units derived from NAH was obtained.

The number of the functional groups (I) per the carbon number of the main chain of 1×10$^6$ is calculated as [a×10$^6$/100], wherein "a" (mol %) is the above proportion.

(Melting Point)

Using a differential scanning calorimeter (DSC device, manufactured by Seiko Instruments Inc.), a melting peak when heating the fluorinated resin (A) at a rate of 10° C./min was recorded, and the temperature (° C.) corresponding to the maximum value was obtained as the melting point.

(Melt Flow Rate)

Using a melt indexer (manufactured by TECHNOL SEVEN CO., LTD.), the mass (g) of the fluorinated resin (A) flowing out for 10 minutes from a nozzle having a diameter of 2 mm and a length of 8 mm at 372° C. which is the temperature higher by at least 20° C. than the melting point under a load of 49 N, was measured.

(Adhesive Strength)

Interface between the heat resistant resin layer and the fluorinated resin layer:

A laminate was cut into a size of a length of 150 mm and a width of 10 mm to prepare a sample to be evaluated. An interface between a heat resistant resin layer and a fluorinated resin layer in the sample was peeled from one end of the length direction to a position of 50 mm. Then, using a tensile tester, the rest was peeled so that the tensile rate would be 50 mm/min at 90°, and the maximum load was obtained as the adhesive strength (N/cm).

(Fluorinated Resin (A-1))

NAH (himic acid anhydride, manufactured by Hitachi Chemical Co., Ltd.) was prepared as monomers to form units (u2), and PPVE (CF$_2$=CFO(CF$_2$)$_3$F, perfluoropropyl vinyl ether, manufactured by Asahi Glass Company, Limited) was prepared as monomers to form units (u3).

A polymerization initiator solution having (perfluorobutyryl) peroxide at a concentration of 0.36 mass % dissolved in 1,3-dichloro-1,1,2,2,3-pentafluoropropane (AK225cb, manufactured by Asahi Glass Company, Limited), was prepared.

An NAH solution having NAH at a concentration of 0.3 mass % dissolved in AK225cb was prepared.

369 kg of AK225cb and 30 kg of PPVE were charged in a preliminarily deaerated polymerization tank having an inner volume of 430 L and provided with a stirrer. The inside of the polymerization tank was heated to 50° C., 50 kg of TFE was further charged, and the pressure in the polymerization tank was increased to 0.89 MPa [gage].

The polymerization was carried out, while continuously adding 3 L (liter) of the polymerization initiator solution in the polymerization tank at a rate of 6.25 mL/min. Further, TFE was continuously charged so that the pressure in the polymerization tank would be maintained at 0.89 MPa [gage] during the polymerization reaction. Further, each amount of the NAH solution corresponding to 0.1 mol % per the mole number of TFE charged in the polymerization, was continuously added.

After over 8 hours from the initiation of the polymerization, and when 32 kg of TFE was charged, the temperature in the polymerization tank was lowered to room temperature, and the pressure was purged to normal pressure. The obtained slurry was subjected to liquid-solid separation, followed by drying for 15 hours at 150° C. to obtain 33 kg of a fluorinated resin (A-1).

The fluorinated resin (A-1) had the following properties.

Specific gravity: 2.15, melting point: 305° C., melt flow rate: 11.0 g/10 min.

Copolymer composition: units derived from TFE/units derived from NAH/units derived from PPVE=97.9/0.1/2.0 (mol %), the content of functional groups (I) (acid anhydride groups): 1,000 groups per $1 \times 10^6$ of the carbon number of the main chain of the fluorinated resin (A-1).

(Fluorinated Resin Film (1))

The fluorinated resin (A-1) was extrusion molded by means of a 30 mmφ single screw extruder having a coat hanger die of 750 mm in width at a die temperature of 340° C. to obtain a fluorinated resin film (1) having a thickness of 25 μm.

(Heat Resistant Resin Film (2))

A polyimide film (Kapton 100EN, heat curable polyimide: tradename of DUPONT-TORAY CO., LTD.) having a thickness of 25 μm was prepared.

Example 1

By means of a thermal roll lamination apparatus having the structure illustrated in FIG. 1, a laminate having 3 layers wherein heat resistant resin layers made of the heat resistant resin film (2) were respectively laminated on both surfaces of a fluorinated resin layer made of the fluorinated resin film (1), was produced.

Both the surface temperature of the metal roll 33 for heating and the surface temperature (thermal lamination temperature) of a pair of the metal rolls 31 and 32 for thermal lamination were set to 380° C. The thermal lamination pressure was set to 784 N/cm, the conveying rate of a temporary laminate (thermal lamination rate) was set to 3 m/min.

The conveying time (preliminary heating time) of from the moment when the temporary laminate was in contact with the periphery of the metal roll 33 for heating to the moment immediately before the temporary laminate passes between the metal rolls 31 and 32 for thermal lamination, was set to 24 seconds. The non-heating time during the temporary laminate passes between the metal roll 33 for heating and the metal roll 32 for thermal lamination was short at a level to be ignored. The temperature (preliminary heating temperature) of the temporary laminate immediately before pressing by the metal rolls 31 and 32 for thermal lamination was 380° C.

A laminate was stably produced under the above condition without any problem. The adhesive strength at an interface between the fluorinated resin layer and the heat resistant resin layer in the obtained laminate was 8 N/cm.

Example 2

In Example 1, both the surface temperature of the metal roll 33 for heating and the thermal lamination temperature were changed to 400° C. The thermal lamination rate was changed to 6 m/min, and the preliminary heating time was set to 12 seconds. The thermal lamination pressure was set to 784 N/cm which is the same as in Example 1. The preliminary heating temperature was 400° C.

Under the above conditions, a laminate could be stably produced without any problem. The adhesive strength at an interface between the fluorinated resin layer and the heat resistant layer in the obtained laminate was 5 N/cm.

Comparative Example 1

In Comparative Example 1, a laminate having the same structure as in Example 1 was produced, except that the preliminary heating step was not carried out.

Figure 2:
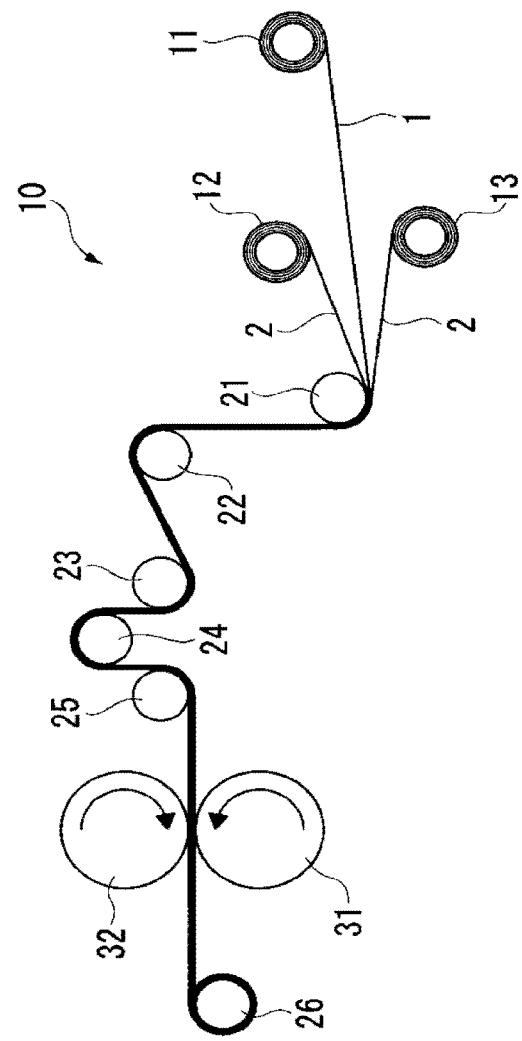
FIG. 2 is a schematic structural view illustrating thermal lamination apparatus of comparative examples.

FIG. 2 is a schematic construction view illustrating a thermal roll lamination apparatus used in Comparative Example 1. The same construction elements as in FIG. 1 are provided with the same symbols, and their explanations are omitted.

The surface temperature (thermal lamination temperature) of a pair of the metal rolls 31 and 32 for thermal lamination was set to 340° C., the thermal lamination pressure was set to 784 N/cm, and the thermal lamination rate was set to 2 m/min.

The temperature of the temporary laminate immediately before pressed by the metal rolls 31 and 32 for thermal lamination was substantially the same as atmospheric temperature (25° C.).

In Comparative Example 1, the thermal lamination temperature and the thermal lamination rate were conditions milder than those in Example 1, however, at the moment when the temporary laminate was pressed by the metal rolls 31 and 32 for thermal lamination, the fluorinated resin layer cut, and thereby a laminate could not be obtained.

INDUSTRIAL APPLICABILITY

The laminate obtained by the process for producing laminate of the present invention, was useful for producing a flexible printed board required to have high electric reliability.

This application is a continuation of PCT Application No. PCT/JP2017/009071, filed on Mar. 7, 2017, which is based upon and claims the benefit of priority from Japanese Patent Application No. 2016-44175 filed on Mar. 8, 2016. The contents of those applications are incorporated herein by reference in their entireties.

REFERENCE SYMBOLS

1: Fluorinated resin film, 2: heat resistant resin film, 10: thermal roll lamination apparatus, 11, 12 and 13: delivering roll, 21, 22, 23, 24 and 25: conveyer roll, 26: wind-up roll, 31 and 32: metal rolls for thermal lamination, 33: metal roll for heating

What is claimed is:

1. A process for producing a laminate comprising a fluorinated resin layer made of a fluorinated resin film, and heat resistant resin layers made of a heat resistant resin film, the process comprising:

a preliminary heating, while conveying without pressing in a thickness direction, a temporary laminate, wherein heat resistant resin films made of a heat resistant resin are laminated on both surfaces of the fluorinated resin film made of a melt-moldable fluorinated resin having at least one functional group selected from the group consisting of a carbonyl group-containing group, a hydroxyl group, an epoxy group and an isocyanate group, and after the preliminary heating, conducting a thermal lamination by pressing the temporary laminate in the thickness direction, while heating the temporary laminate at a thermal lamination temperature, wherein the thermal lamination temperature is from a melting point of the melt-moldable fluorinated resin to 420° C., thereby bonding layers and producing the laminate, wherein in the thermal lamination, a temperature of the temporary laminate immediately before pressing the temporary laminate is a temperature from 20° C. lower than a melting point of the melt-moldable fluorinated resin to the thermal lamination temperature, and wherein the melt-moldable fluorinated resin has a melting point of from 260 to 320° C.

2. The process for producing a laminate according to claim 1, wherein the fluorinated resin film is a monolayer film or a laminated film and has a total thickness of from 1 to 1,000 μm.

3. The process for producing a laminate according to claim 1, wherein the melt-moldable fluorinated resin has a melt flow rate of from 0.5 to 15 g/10 min at 372° C. under a load of 49N.

4. The process for producing a laminate according to claim 1, wherein the melt-moldable fluorinated resin is a fluoropolymer comprising units (u1) derived from tetrafluoroethylene (TFE), units (u2) derived from a cyclic hydrocarbon monomer comprising an acid anhydride and units (u3) derived from a fluorinated monomer, except TFE.

5. The process for producing a laminate according to claim 1, wherein the heat resistant resin films are monolayer films or laminated films and have a total thickness of from 3 to 500 μm.

6. The process for producing a laminate according to claim 1, wherein the heat resistant resin films are heat curable resin films.

7. The process for producing a laminate according to claim 6, wherein the heat curable resin is a heat curable polyimide, an epoxy resin or an acrylic resin.

8. The process for producing a laminate according to claim 6, wherein the heat curable resin is a polyimide formed by imidizing a polyamic acid obtained by polycondensation of a polyvalent carboxylic acid dianhydride and diamine.

9. The process for producing a laminate according to claim 6, wherein the thermal lamination temperature is from 350 to 420° C.

10. The process for producing a laminate according to claim 6, wherein the thermal lamination pressure is from 49 to 1,764 N/cm of roll pressure represented by load to be applied per 1 cm width of a roll.

11. The process for producing a laminate according to claim 1, wherein the temporary laminate further comprises a metal foil layer on a surface of a side opposite a surface which is in contact with the fluorinated resin film, of at least one of the heat resistant resin films.

12. The process for producing a laminate according to claim 11, wherein the metal foil layer is a foil made of copper or an alloy thereof, stainless steel, nickel or an alloy thereof, or aluminum or an alloy thereof.

13. A process for producing a printed circuit board, the process comprising:
producing a laminate by the process of claim 12 and etching the metal foil layer of the obtained laminate to form a patterned circuit.

* * * * *